United States Patent [19]

Ikeyama et al.

[11] Patent Number: 5,408,266
[45] Date of Patent: Apr. 18, 1995

[54] BI-DIRECTIONAL RATE CONVERTING APPARATUS FOR CONVERTING A CLOCK RATE OF A DIGITAL SIGNAL

[75] Inventors: Hiromasa Ikeyama; Takashi Asaida, both of Kanagawa, Japan

[73] Assignee: Sony Corporation, Tokyo, Japan

[21] Appl. No.: 189,640

[22] Filed: Feb. 1, 1994

[30] Foreign Application Priority Data

Feb. 3, 1993 [JP] Japan .................. 5-016512
Dec. 28, 1993 [JP] Japan .................. 5-336263

[51] Int. Cl.⁶ ............................................... H04N 9/04
[52] U.S. Cl. ...................................... 348/222; 348/234
[58] Field of Search .................. 348/222, 234; 358/41, 358/906; H04N 9/04, 9/02, 11/20; 341/61

[56] References Cited

U.S. PATENT DOCUMENTS 5,095,364 3/1992 Asaida .................. 348/234

Primary Examiner—James J. Groody
Assistant Examiner—Sherrie Hsia
Attorney, Agent, or Firm—William S. Frommer; Alvin Sinderbrand

[57] ABSTRACT

Bi-directional rate converting apparatus up-converts a digital signal having a clock rate $f_B$ to a digital signal having a clock rate $f_A$ and also down-converts a digital signal having a clock rate $f_A$ to a digital signal having the clock rate $f_B$. The digital signal having the clock rate $f_B$ is interpolated to produce a signal having the clock rate $f_A$ which is supplied to a filter during up-conversion. The digital signal having the clock rate $f_A$ is supplied to the filter during down-conversion, which after being filtered is thinned to produce a digital signal having the clock rate $f_B$. The digital signal supplied to the filter is filtered in accordance with a frequency characteristic which has "0" points at frequencies of $(f_C/M)*x$, where x equals an integer value from 1 to $(M-1)$, and which also has "0" points at frequencies of $(f_C/L)*y$, where y equals an integer value from 1 to $(L-1)$. The value $f_C$ being the least common multiple of $f_A$ and $f_B$ such that $f_C = M*f_A = L*f_B$, where M and L have respective integer values.

18 Claims, 12 Drawing Sheets

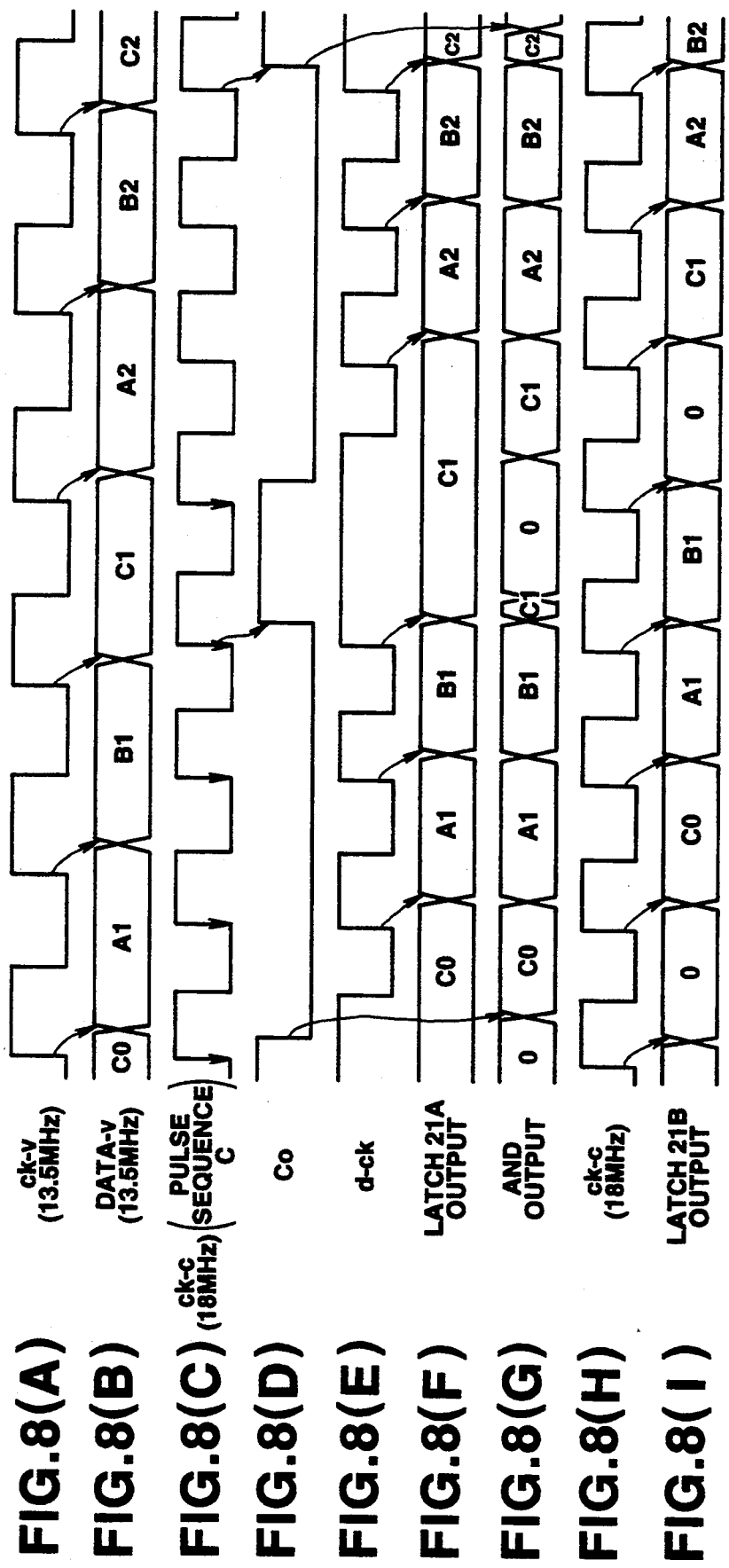

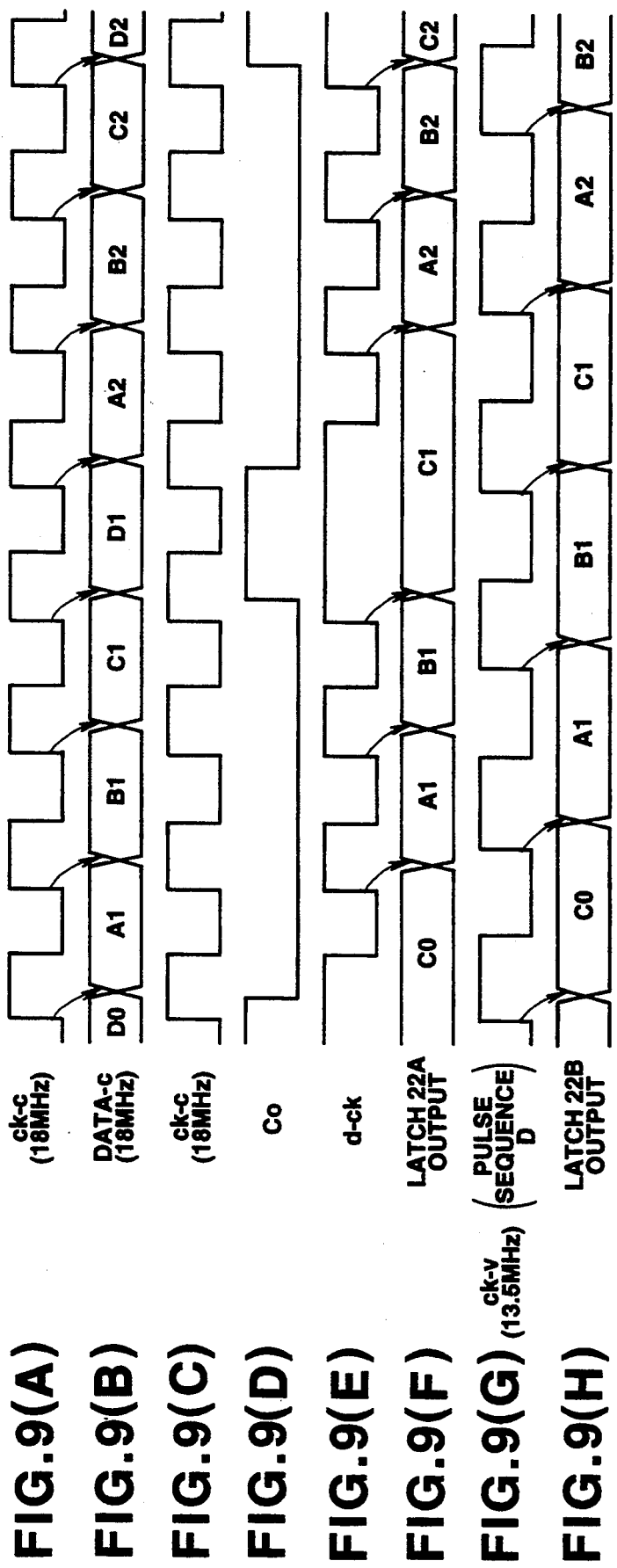

BI-DIRECTIONAL RATE CONVERTING APPARATUS FOR CONVERTING A CLOCK RATE OF A DIGITAL SIGNAL

BACKGROUND OF THE INVENTION

The present invention relates to rate converting apparatus for converting clock rates of digital signals.

In order for two digital circuits operating at different clock rates to communicate with one another, a rate convertor must convert the clock rates of digital signals communicated between these two circuits. In the case of an image pickup device transmitting digital video data to the digital signal processing circuit of a digital video tape recorder utilizing the D-1 format, the digital video data must be down-converted from a clock rate of, for example, 18 MHz to a clock rate of 13.5 MHz. Similarly, it may be necessary to up-convert the digital video data having the clock rate of 13.5 MHz to the clock rate of 18 MHz when digital video signals reproduced by the digital video tape recorder are transmitted to an output device having a clock rate of 18 MHz.

A known down conversion apparatus for converting the clock rate of an input digital signal from a relatively high input clock rate to a relatively lower output clock rate, first obtains a digital signal having a clock rate equal to the least common multiple of the input clock rate and the output clock rate by means of up-converting the original input digital signal. That is, if a digital signal having a clock rate of 18 MHz is supplied to the apparatus and it is desired to down-convert the clock rate to 13.5 MHz, the input digital signal is up-converted to a clock rate of 54 MHz, the least common multiple of 13.5 MHz and 18 MHz, before it is down-converted to the clock rate of 13.5 MHz.

The aforementioned known down-rate conversion process will be described with reference to the time domain diagrams of FIGS. 1(A) to 1(E) and the frequency domain diagrams of FIGS. 2(A) to 2(E). Using the above example of down-converting a digital signal from the clock rate of 18 MHz to the clock rate of 13.5 MHz, FIG. 1(A) illustrates an input signal $\{X_n\}$ having a clock rate of 18 MHz, wherein the input data has a spectrum as shown in FIG. 2(A). During down-conversion, "0" data points are inserted at empty locations in the signal which correspond to sample points of a signal having the clock rate of 54 MHz, which is the least common multiple of 13.5 MHz and 18 MHz, resulting in the signal shown in FIG. 1(B) halving a spectrum shown in FIG. 2(B).

The 54 MHz data is filtered by a filter having a characteristic as shown in FIG. 1(C) and in FIG. 2(C). Because the clock rate of the output signal is 13.5 MHz, if there are frequency components above 6.75 MHz, other than the 54 MHz component, the output signal suffers distortion due to aliasing. Consequently, these frequency components are suppressed by a low pass filter. The filtered signal, designated $Y_n$ hereinbelow, as shown in FIG. 1(D) has a clock rate of 54 MHz and a frequency spectrum as illustrated in FIG. 2(D).

The filter supplies the time domain data $\{Y_n\}$, by utilizing the filter transfer function:

$$F_1(z) = \sum_{j=0}^{11} k^* z^{-j}$$

This transfer function employs twelve taps (j=0 to j=11), where $z^{-j}$ indicates the amount of delay of the input signal X such that $X_{n+1} = z^{-n} * X_1$. The data $Y_n$ for each of fourteen successive clock cycles (n=1 to 14) are calculated by the following equations:

$$Y_1 = k_2 * X_4 = k_5 * X_3 = k_8 * X_2 = k_{11} * X_1$$

$$Y_2 = k_0 * X_5 = k_3 * X_4 = k_6 * X_3 = k_9 * X_2$$

$$Y_3 = k_1 * X_5 = k_4 * X_4 = k_7 * X_3 = k_{10} * X_2$$

$$Y_4 = k_2 * X_5 = k_5 * X_4 = k_8 * X_3 = k_{11} * X_2$$

$$Y_5 = k_0 * X_6 = k_3 * X_5 = k_6 * X_4 = k_9 * X_3$$

$$Y_6 = k_1 * X_6 = k_4 * X_5 = k_7 * X_4 = k_{10} * X_3$$

$$Y_7 = k_2 * X_6 = k_5 * X_5 = k_8 * X_4 = k_{11} * X_3$$

$$Y_8 = k_0 * X_7 = k_3 * X_6 = k_6 * X_5 = k_9 * X_4$$

$$Y_9 = k_1 * X_7 = k_4 * X_6 = k_7 * X_5 = k_{10} * X_4$$

$$Y_{10} = k_2 * X_7 = k_5 * X_6 = k_8 * X_5 = k_{11} * X_4$$

$$Y_{11} = k_0 * X_8 = k_3 * X_7 = k_6 * X_6 = k_9 * X_5$$

$$Y_{12} = k_1 * X_8 = k_4 * X_7 = k_7 * X_6 = k_{10} * X_5$$

$$Y_{13} = k_2 * X_8 = k_5 * X_7 = k_8 * X_6 = k_{11} * X_5$$

$$Y_{14} = k_0 * X_9 = k_3 * X_8 = k_6 * X_7 = k_9 * X_6$$

The above calculations are repeated every fourteen clock cycles to provide successive values of $Y_n$. The resulting 54 MHz digital signal is down-converted to a clock rate of 13.5 MHz by merely selecting data at a clock rate of 13.5 MHz as shown in FIG. 1(E), the resulting data having a frequency domain characteristic as shown in FIG. 2(E). Since the down-converted clock signal contains all of the frequency components of the input signal $\{X_n\}$, distortion is avoided.

A known up-rate conversion apparatus will be described with reference to the time domain diagrams of FIGS. 3(A) to 3(E) and the frequency domain diagrams of FIGS. 4(A) to 4(E). FIG. 3(A) illustrates an input signal $\{X_n\}$ having a clock rate of 13.5 MHz, the input data having a spectrum shown in FIG. 4(A). During up-conversion, "0" data points are inserted at empty locations in the signal which correspond to sample points of a signal having a clock rate of 54 MHz, as the least common multiple of 18 MHz and 13.5 MHz, resulting in the signal shown in FIG. 3(B) having a spectrum shown in FIG. 4(B).

The data whose clock rate is 54 MHz is filtered by a filter having the characteristics shown in FIG. 3(C) and in FIG. 4(C). Because the clock rate of the output signal is 18 MHz, frequency components above 9 MHz cause distortion due to aliasing, and thus, these frequency components are suppressed by a low pass filter. The filtered signal $Y_n$ shown in FIG. 3(D), has a clock rate of 54 MHz and a frequency spectrum as illustrated in FIG. 4(D).

The filter supplies the time domain data $\{Y_n\}$ by utilizing the filter transfer function:

$$F_2(z) = \sum_{j=0}^{11} k^* z^{-j}$$

This transfer function employs twelve taps (j=0 to j=11), where $z^{-j}$ indicates the amount of delay of the input signal X, such that $X_{n+1}=z^{-n}*X_1$, $Y_1$ to $Y_{14}$. The data $Y_n$ for each of fourteen successive clock cycles are calculated by the following equations:

$$Y_1=k_3*X_3=k_7*X_2=k_{11}*X_1$$

$$Y_2=k_0*X_4=k_4*X_3=k_8*X_2$$

$$Y_3=k_1*X_4=k_5*X_3=k_9*X_2$$

$$Y_4=k_2*X_4=k_6*X_3=k_{10}*X_2$$

$$Y_5=k_3*X_4=k_7*X_3=k_{11}*X_2$$

$$Y_6=k_0*X_5=k_4*X_4=k_8*X_3$$

$$Y_7=k_1*X_5=k_5*X_4=k_9*X_3$$

$$Y_8=k_2*X_5=k_6*X_4=k_{10}*X_3$$

$$Y_9=k_3*X_5=k_7*X_4=k_{11}*X_3$$

$$Y_{10}=k_0*X_6=k_4*X_5=k_8*X_4$$

$$Y_{11}=k_1*X_6=k_5*X_5=k_9*X_4$$

$$Y_{12}=k_2*X_6=k_6*X_5=k_{10}*X_4$$

$$Y_{13}=k_3*X_6=k_7*X_5=k_{11}*X_4$$

$$Y_{14}=k_0*X_7=k_4*X_6=k_8*X_5$$

The above calculations are repeated every fourteen clock cycles to provide successive values of $Y_n$. The resulting 54 MHz digital signal is down-converted to a clock rate of 18 MHz by selecting data at a clock rate of 18 MHz as shown in FIGS. 3(E) and 4(E). Since the down-converted clock signal contains all of the frequency components of the input signal $\{X_n\}$, distortion is avoided.

Where it is desired to employ an 18 MHz clock rate digital camcorder with a D-1 digital VTR (having a 13.5 MHz clock rate), both a down rate converter and an up rate converter are required. Consequently, these prior art arrangements are relatively complex.

OBJECTS OF THE INVENTION

Therefore, it is an object of the present invention to provide bi-directional rate converting apparatus for up-rate converting and down-rate converting a digital signal between two different clock rates which overcomes the shortcomings of the foregoing apparatus.

An additional object of this invention is to provide hi-directional rate converting apparatus having a simplified structure.

Various other objects, advantages and features of the present invention will become readily apparent to those of ordinary skill in the art, and the novel features will be particularly pointed out in the appended claims.

SUMMARY OF THE INVENTION

In accordance with one aspect of the present invention, bi-directional rate converting apparatus are provided which serve to selectively up-convert a clock rate $f_B$ of a digital signal to a clock rate $f_A$ and selectively down-convert the clock rate $f_A$ of a digital signal to the clock rate $f_B$. The apparatus further serves to filter the digital signal in accordance with a frequency characteristic which has "0" points at frequencies of $(f_C/M)*x$, x having the integer values from 1 to (M−1), and which also has "0" points at frequencies of $(f_C/L)*y$, y having the integer values from 1 to (L−1). The value $f_C$ is the least common multiple of $f_A$ and $f_B$ such that $f_C=M*f_A=L*f_B$, where M and L have respective integer values. The frequencies of the digital signal at the "0" point frequencies are suppressed substantially to zero.

In accordance with another aspect of the present invention, a bi-directional rate converting apparatus is provided for converting a clock rate of a digital signal having one of a lower clock rate $f_B$ and a higher clock rate $f_A$ to the other thereof. The apparatus includes interpolating means for interpolating the digital signal having the clock rate $f_B$ to produce an interpolated digital signal having the clock rate $f_A$. The interpolated digital signal having the clock rate $f_A$ is selected in an up-conversion mode and the digital signal having the clock rate $f_A$ is selected in a down-conversion mode. The selected signal is filtered to provide a filtered digital signal having the clock rate $f_A$ as an output. The selected signal is filtered in accordance with a predetermined frequency characteristic which has "0" points at frequencies of $(f_C/M)*x$, x having the integer values from 1 to (M−1), and which also has "0" points at frequencies of $(f_C/L)*y$, y having the integer values from 1 to (L−1). The value $f_C$ is the least common multiple of $f_A$ and $f_B$ such that $f_C=M*f_A=L*f_B$, where M and L have respective integer values. The frequencies of the selected signal at the "0" point frequencies are suppressed substantially to zero. The filtered digital signal having the clock rate $f_A$ is thinned to produce an output digital signal having the clock rate $f_B$ in the down-conversion mode, and the filtered digital signal having the clock rate $f_A$ is supplied as an output digital signal in the up-conversion mode.

In accordance with another aspect of the present invention, a video camera comprises an image pickup means which provides a digital image signal having a clock rate $f_A$, and a recording and reproducing means for selectively recording a digital image signal having a clock rate $f_B$ in a recording medium in a recording mode of the video camera and selectively reproducing a digital image signal having the clock rate $f_B$ in a reproducing mode of the video camera, the clock rate $f_B$ being different from the clock rate $f_A$. The video camera also includes a rate converting means for selectively converting the clock rate $f_A$ of the digital image signal provided from the image pickup means to the clock rate $f_B$, and supplying the digital image signal having the clock rate $f_B$ to the recording and reproducing means. The rate converting means also selectively converts the clock rate $f_B$ of the reproduced digital image signal to the clock rate $f_A$ to produce a rate converted reproduced signal. The rate converting means includes filter means for filtering a selected one of the digital image signal and the rate converted reproduced signal in accordance with a predetermined frequency characteristic having "0" points at frequencies of $(f_C/M)*x$, where x has the integer values from 1 to (M−1), and at frequencies of $(f_C/L)*y$, where y has the integer value from 1 to (L−1). The value $f_C$ is the least common multiple of $f_A$ and $f_B$ such that $f_C=M*f_A=L*f_B$, where M and L have respective integer values. The frequencies of the selected signal at the "0" point frequencies are suppressed substantially to zero by the filter means.

BRIEF DESCRIPTION OF THE DRAWINGS

The following detailed description, given by way of example and not intended to limit the present invention solely thereto, will best be appreciated in conjunction with the accompanying drawings, wherein like reference numerals denote like elements and parts, in which:

FIGS. 8(A) to 8(I) are timing diagrams illustrating up-rate conversion of the clock rate of a digital signal using the converter of FIGS. 5-7;

FIGS. 9(A) to 9(H) are timing diagrams illustrating down-rate conversion of the clock rate of a digital signal using the convertor of FIGS. 5-7;

DETAILED DESCRIPTION OF CERTAIN PREFERRED EMBODIMENTS

Figure 1:
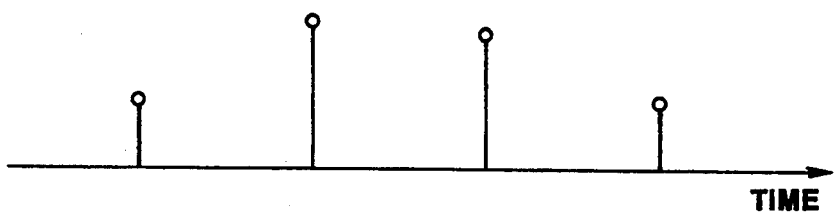
FIGS. 1(A) to 1(E) are diagrams in the time domain to illustrate a known method of down-rate conversion.
Figure 1:
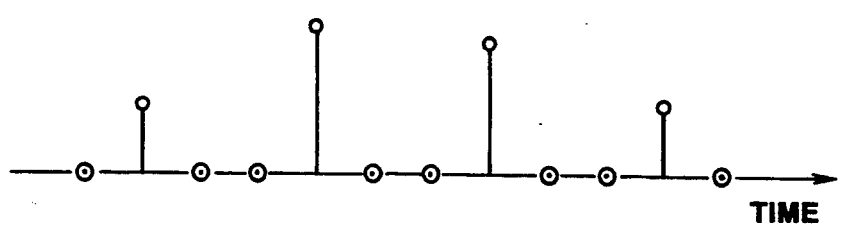
Figure 1:
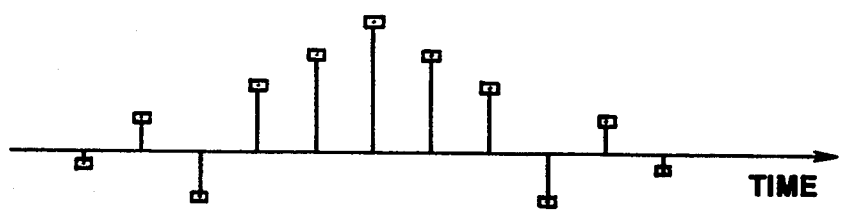
Figure 1:
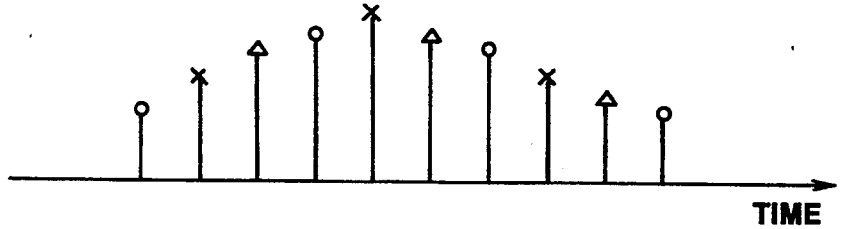
Figure 1:
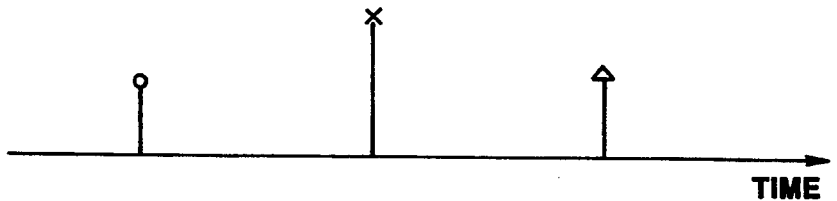
Figure 2:
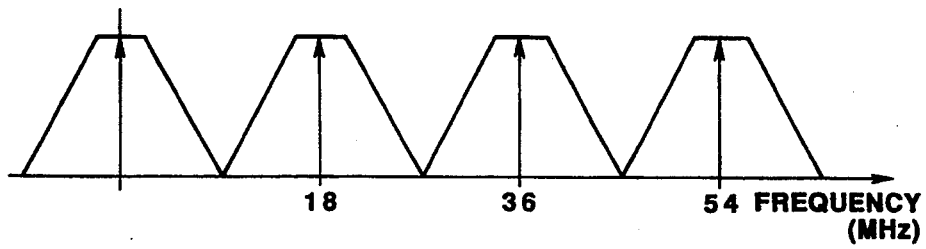
FIGS. 2(A) to 2(E) are diagrams in the frequency domain to illustrate the known method of down-rate conversion.
Figure 2:
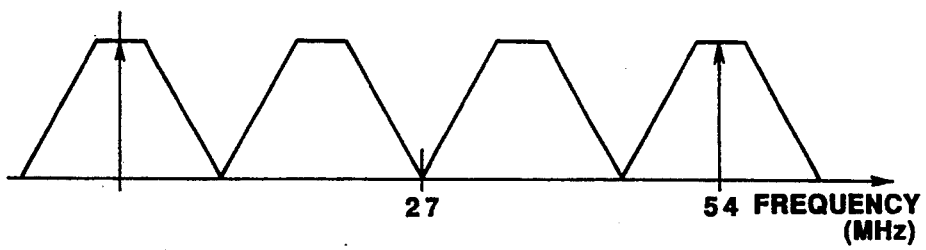
Figure 2:
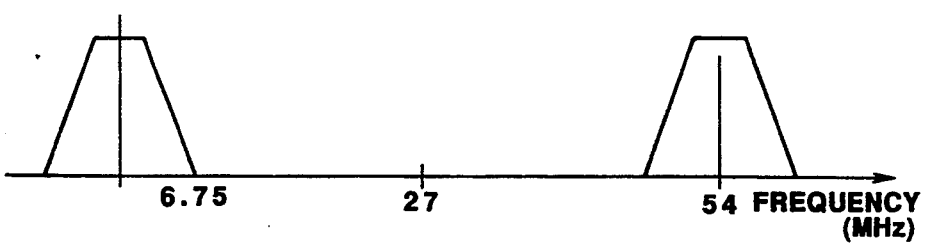
Figure 2:
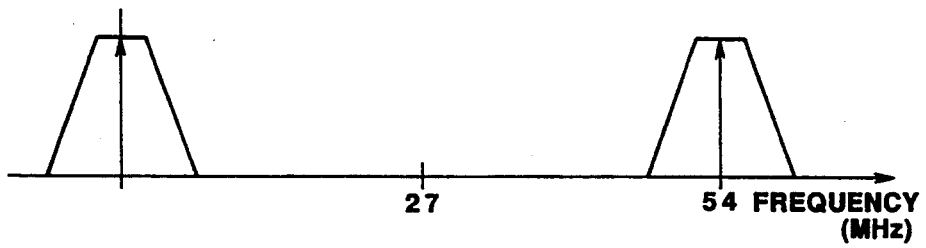
Figure 2:
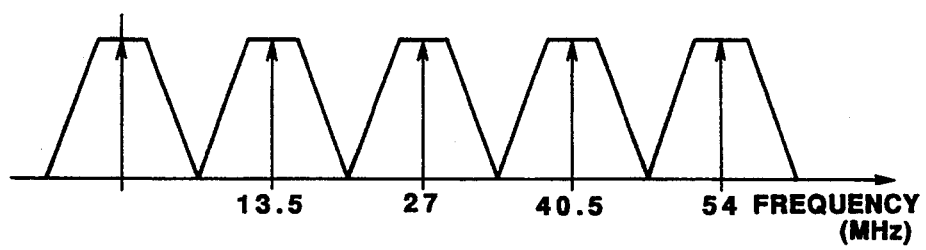
Figure 3:
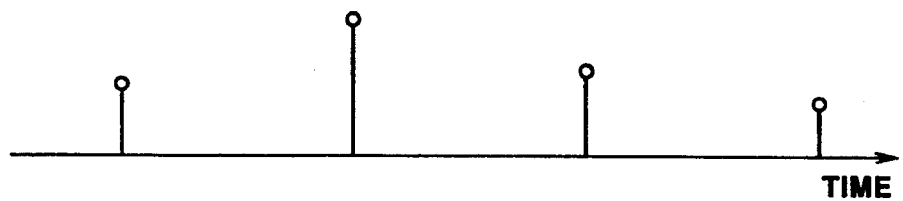
FIGS. 3(A) to 3(E) are diagrams in the time domain to illustrate a known method of up-rate conversion.
Figure 3:
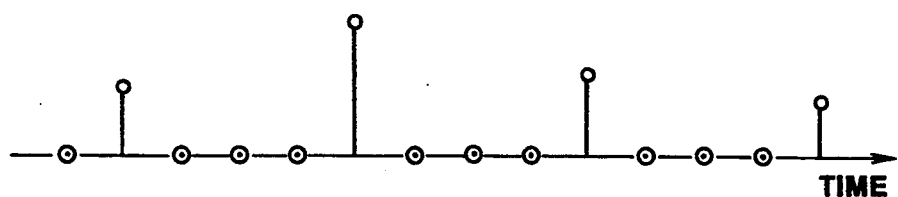
Figure 3:
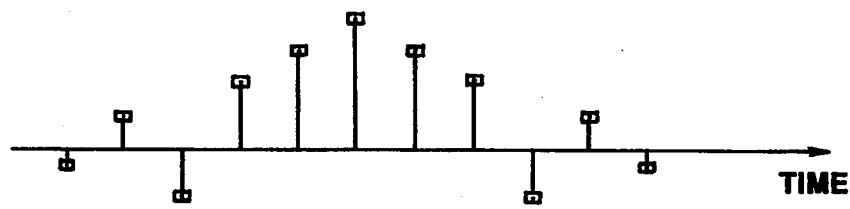
Figure 3:
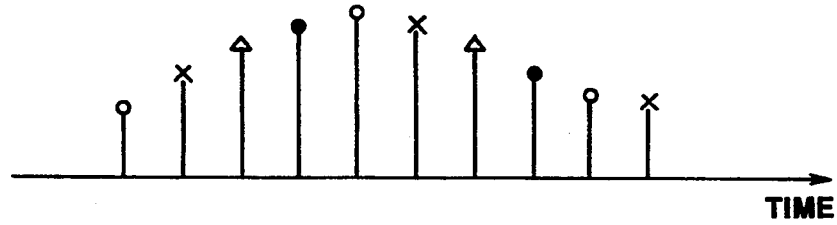
Figure 3:
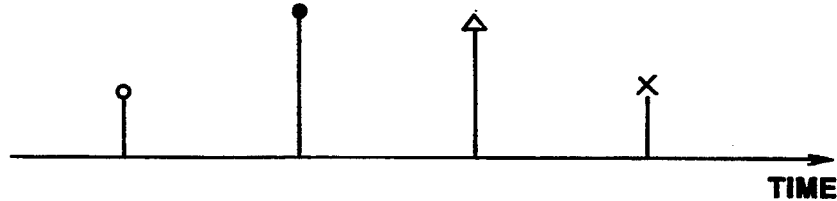
Figure 4:
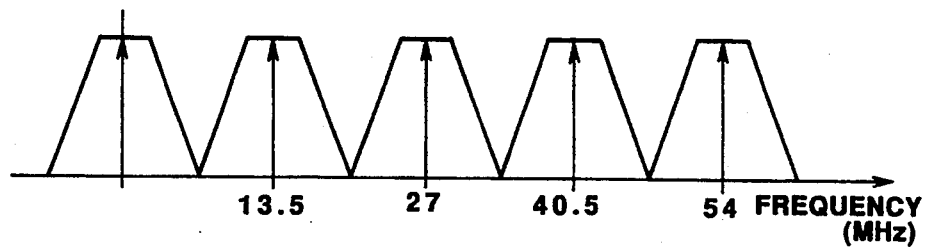
FIGS. 4(A) to 4(E) are diagrams in the frequency domain to illustrate the known method of up-rate conversion.
Figure 4:
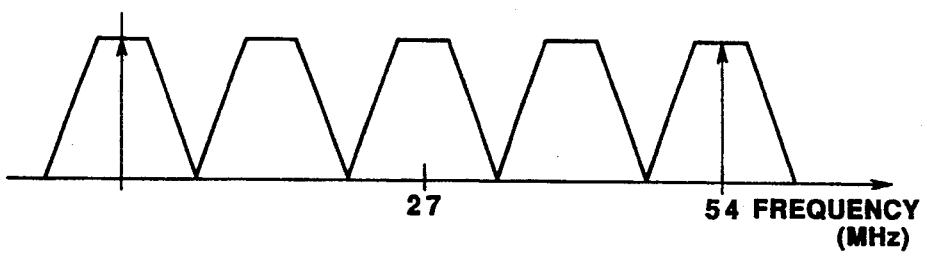
Figure 4:
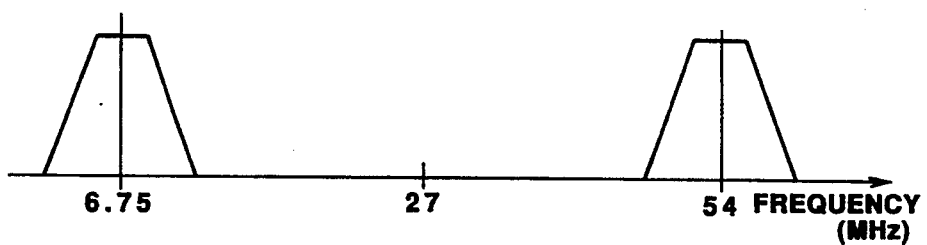
Figure 4:
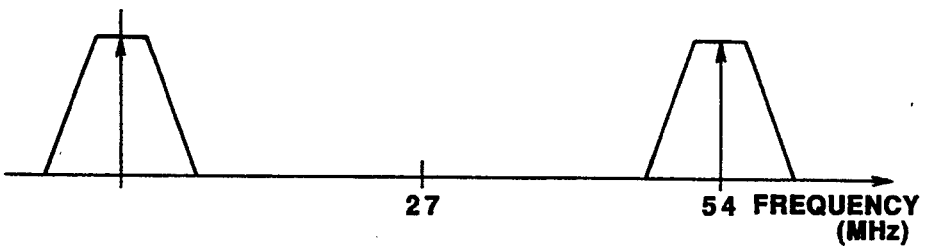
Figure 4:
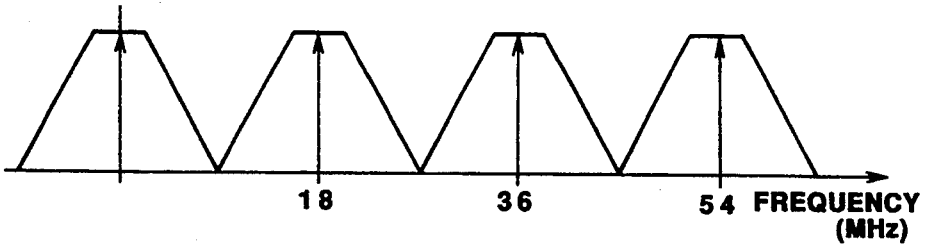
Figure 5:
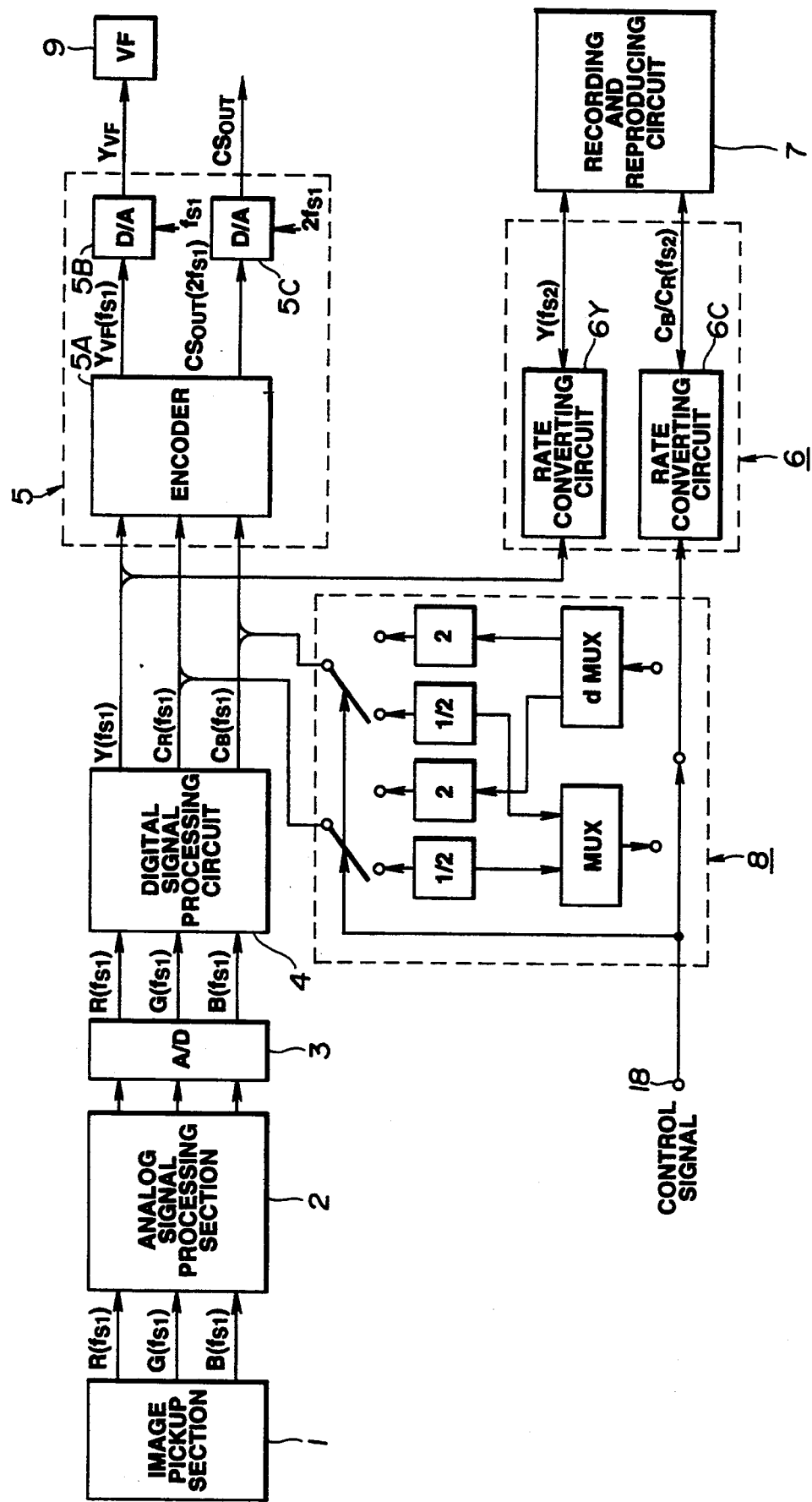
FIG. 5 is a block diagram of a digital camcorder using a bi-directional rate convertor in accordance with an embodiment of the present invention.

Referring now to the drawings, FIG. 5 shows a block diagram of a digital camcorder using an embodiment of a bi-directional rate convertor in accordance with the present invention. The digital camcorder of FIG. 5 is comprised of an image pickup device 1, an analog signal processing circuit 2, an analog to digital convertor 3, a digital signal processing circuit 4, an encoding circuit 5, a rate convertor 6, a recording and reproducing circuit 7, a multiplexing-demultiplexing circuit 8 and an output device 9.

The image pickup device 1 receives a light image and generates three primary color signals R(fs1), G(fs1) and B(fs1), each having a clock rate fs1, and supplies the three signals to the analog signal processing circuit 2. The image pickup device 1 may include an imaging lens for receiving a light image, an optical low pass filter for removing the high frequency components of the light image, a color duplicating prism which separates the light image into its three primary color components and three charge coupled devices (CCD) which are activated at the clock rate fs1, the clock rate being determined by the number of pixels of the charge coupled devices. In addition, the image pickup device 1 may utilize what has become known in the art as the spatial offset method where the charge coupled devices for the red image and the blue image are offset in a horizontal direction by one-half of the spatial sampling frequency $T_S$, with respect to the charge coupled device for the green image.

The analog signal processing circuit 2 processes the three primary color signals by correlated double sampling (CDS) and controls the white balance and the black balance of each signal. The analog to digital convertor 3 converts the three primary color signals processed by the analog signal processing circuit 2 into digital signals having a clock rate fs1 which is the same as the sampling rate, in order to provide a high resolution video signal. The three digital color signals are supplied to the digital signal processing circuit 4.

The digital signal processing circuit 4 performs various conventional operations on the three digital color signals R(fs1), G(fs1) and B(fs1), which may include image enhancing for enhancing edges of the image features, pedestal level adding, non-linear processing such as gamma and knee operations and linear matrix operations to adjust the R, G and B signals to compensate for distortions caused by the optical filter in the image pickup device 1. In addition, the digital signal processing circuit 4 performs matrix processing of the R, G and B signals to generate a digital luminance signal Y(fs1) and two digital color difference signals CR(fs1) and CB(fs1), all of which have a clock rate fs1. The digital luminance signal Y(fs1) is supplied to the encoding circuit 5 and to the rate convertor 6 via a bi-directional bus. The two digital color difference signals CR(fs1) and CB(fs1) are supplied to the encoding circuit 5 and the multiplexing-demultiplexing circuit 8 via respective bi-directional busses.

The encoding circuit 5 includes a digital encoder 5A which receives the digital luminance signal Y(fs1) and the two digital color difference signals CR(fs1) and CB(fs1) and generates a digital composite video signal $CS_{out}$ and a digital monitor signal $Y_{yf}$ for use with the NTSC or PAL systems. Digital to analog convertors 5B and 5C convert the digital composite video signal $CS_{out}$ and the digital monitor signal $Y_{yf}$ into analog signals having the clock rate fs1. The analog monitor signal $Y_{yf}$ is supplied to an output device 9 which may, for example, be a video monitor which displays the video image.

The multiplexing-demultiplexing circuit 8 receives a control signal at a terminal 18 which indicates whether the camcorder is in a recording mode, wherein a video image received by the image pickup device 1 is recorded by the recording and reproducing circuit 7, or in a reproducing mode, wherein a video image reproduced by the recording and reproducing circuit 7 is supplied to output device 9. During the recording mode, the multiplexing-demultiplexing circuit 8 receives the two digital color difference signals CR(fs1) and CB(fs1) from the digital signal processing circuit 4 via the respective bi-directional busses and performs a multiplexing operation so as to produce a single multiplexed digital color difference signal CB/CR(fs1) which is supplied to the rate convertor 6. During the reproducing mode, the multiplexing-demultiplexing circuit 8 receives a multiplexed digital color difference signal CB/CR(fs1) from the rate convertor 6, demultiplexes the signal, and supplies the two digital color difference signals CR(fs1) and CB(fs1) to the encoding circuit 5 via the respective bi-directional busses.

The rate convertor 6, which is a bi-directional rate convertor, includes rate converting circuits 6Y and 6C for converting the clock rate of the digital luminance signal and the digital color difference signal, respectively. Rate converting circuits 6Y and 6C are similar in construction to one another. During the recording mode, the rate convertor 6 receives the digital luminance signal Y(fs1) and the digital color difference signal CB/CR(fs1) and converts the clock rate fs1 of these two signals to a clock rate fs2. The two signals Y(fs2) and CB/CR(fs2) are then supplied to the recording and reproducing circuit 7 which records the two signals onto, for example, a magnetic tape. Conversely, during the reproducing mode, the rate convertor 6 receives the digital luminance signal Y(fs2) and the digital color difference signal CB/CR(fs2) reproduced by the recording and reproducing circuit 7 and converts their clock rate fs2 to the clock rate fs1. Signal Y(fs1) is supplied to the encoding circuit 5 and signal CB/CR(fs1) is supplied to the multiplexing-demultiplexing circuit 8.

It is to be noted that since a single recording-reproducing device does not record and reproduce a video signal simultaneously, the camcorder of the present invention functions in only one mode at a time (i.e. recording or reproducing) and therefore, it is not necessary for the rate convertor 6 to perform up-rate conversion and down-rate conversion, that is, convert the clock rate from fs1 to fs2 and from fs2 to fs1, at the same time. Thus, up-rate conversion and down-rate conversion may be performed by the same convertor in accordance with the present invention.

Figure 6:
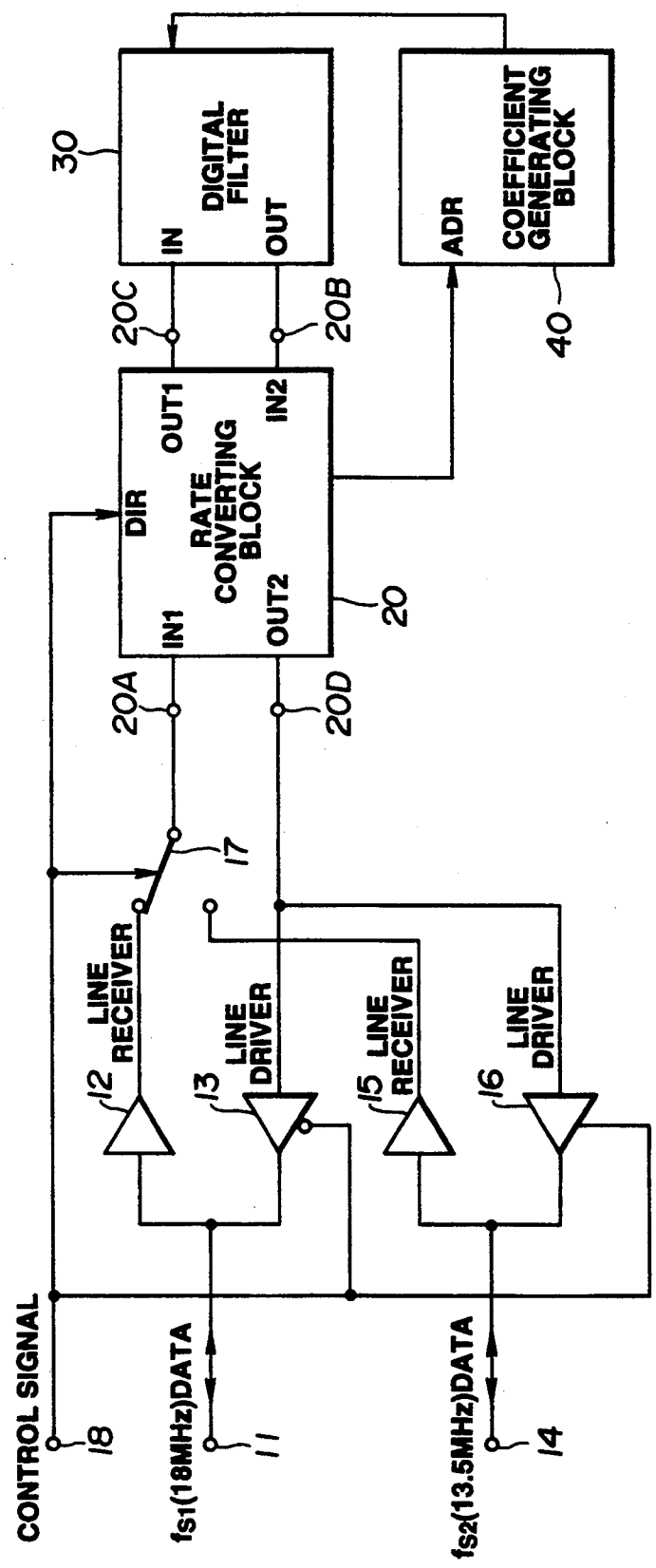
FIG. 6 is a block diagram of the bi-directional rate convertor of FIG. 5.

FIG. 6 is a block diagram illustrating the bi-directional rate converting circuit of the present invention, which comprises I/O terminals 11 and 14, a control signal terminal 18, line receivers 12 and 15, line drivers 13 and 16, a switch 17, a rate converting block 20, a digital filter circuit 30 and a filter coefficient generating block 40.

The control signal is supplied to terminal 18 and as previously described, indicates whether the system is in a recording mode or in a reproducing mode. Terminal 18 is connected to switch 17 and line drivers 13 and 16, the state of each being dependent upon the value of the control signal. Terminal 18 is also connected to the rate converting block 20.

During the recording mode, I/O terminal 11 receives a digital signal having the clock rate fs1 which was initially supplied by the image pickup device 1 and supplies the digital signal to the line receiver 12. Switch 17, which is connected on one side to a data input terminal 20A of the rate converting block 20, supplies the digital signal from line receiver 12 to data input terminal 20A during the recording mode. The rate converting block 20, digital filter circuit 30 and filter coefficient generating block 40 (described below) convert the clock rate of the digital signal supplied to data input terminal 20A from fs1 to fs2 and supply a digital signal having the clock rate fs2 at a data output terminal 20D, which is then supplied as an output at I/O terminal 14 through line driver 16, the line driver 16 being enabled to supply the digital signal during the recording mode while line driver 13 is disabled, thus preventing the digital signal supplied at data output terminal 20D from passing through line driver 13. The digital signal having the clock rate fs2 supplied at I/O terminal 14 is then recorded by the recording and reproducing circuit 7 (FIG. 5).

During the reproducing mode, I/O terminal 14 receives a digital signal having the clock rate fs2 reproduced by the recording and reproducing circuit 7 and supplies the digital signal to line receiver 15. Under the control of the signal applied at terminal 18, switch 17 supplies the digital signal from line receiver 15 to data input terminal 20A during the reproducing mode. The rate converting block 20, digital filter circuit 30 and filter coefficient generating block 40 convert the clock rate of the digital signal supplied to data input terminal 20A from fs2 to fs1 and supply the digital signal having the clock rate fs1 at data output terminal 20D which is then supplied as an output at I/O terminal 11 through line driver 13. Under the control of the signal applied at terminal 18, line driver 13 is enabled to supply the digital signal during the reproducing mode while line driver 16 is disabled, preventing the digital signal supplied at the data output terminal 20D from passing through line driver 16. The digital signal having the clock rate fs1 supplied at I/O terminal 11 is ultimately supplied to the output device 9 through encoding circuit 5 (FIG. 5).

The rate converting block 20 includes data input terminal 20A, data output terminal 20D and terminals 20B and 20C. As described above, a digital signal having an initial clock rate is supplied to data input terminal 20A. The rate converting block 20 supplies an output at terminal 20C which is received by the digital filter circuit 30 at an input terminal. The digital filter circuit 30 filters the digital signal and supplies the filtered digital signal to terminal 20B of the rate converting block 20. The rate converting block 20 completes the rate conversion process and supplies a digital signal at output 20D having a different clock rate than the initial clock rate of the signal supplied to it at data input terminal 20A. In addition, the rate converting block 20 supplies coefficient address data (ADR) to the filter coefficient generating block 40, which in turn generates coefficient information for use by digital filter circuit 30, as further described below.

Figure 7:
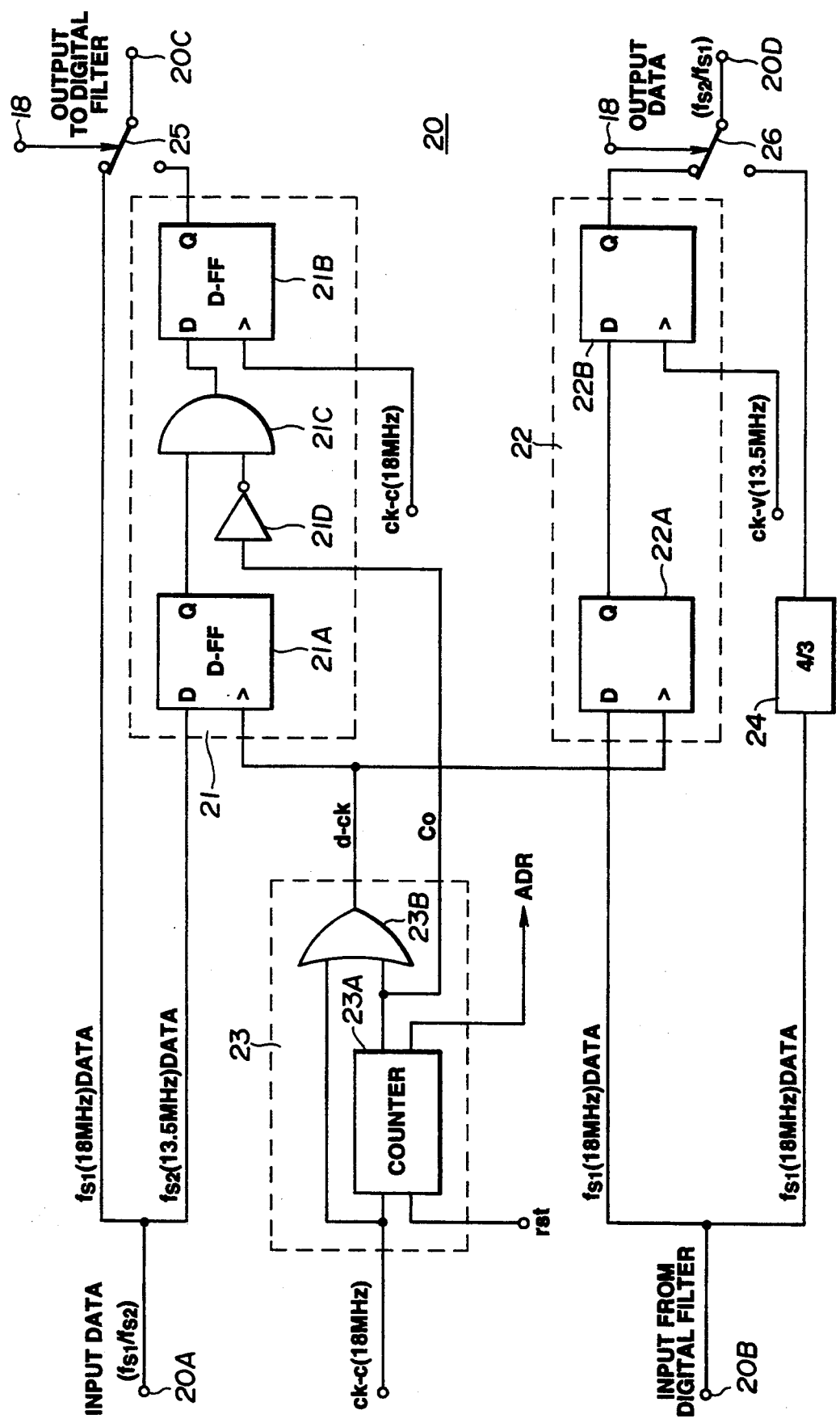
FIG. 7 is a schematic diagram illustrating a bi-directional rate converting circuit included in the convertor of FIG. 6.

FIG. 7 is a schematic diagram illustrating the bi-directional rate convertor block 20 of the present invention. The rate converting block 20 comprises an interpolating circuit 21, a thinning circuit 22, a clock generating circuit 23, a gain adjusting circuit 24 and switches 25 and 26. The control signal, described above, indicates whether the camcorder is in a recording mode or in a reproducing mode. During the recording mode, the rate converting block 20 converts a digital signal having the clock rate fs1, e.g. 18 MHz, into a digital signal having the clock rate fs2, e.g. 13.5 MHz, thereby down-converting the clock rate of the digital signal. During the reproducing mode, the rate converting block 20 converts a digital signal having the clock rate fs2, e.g. 13.5 MHz, into a digital signal having the clock rate fs1, e.g. 18 MHz, thereby up-converting the clock rate of the digital signal. Therefore, the control signal determines whether the rate converting block 20 down-converts the clock rate of the digital signal or up-converts the clock rate of the digital signal.

During down-converting, i.e. recording, under the control of the signal applied to terminal 18, switch 25 is set to its up position supplying the signal received at data input terminal 20A to terminal 20C, supplying the digital signal having a clock rate fs1 to the digital filter circuit 30, and switch 26 is set to its up position supplying the output of the thinning circuit 22 to data output terminal 20D. During up-converting, i.e. reproducing, switch 25 is set to its down position supplying the output of the interpolating circuit 21 to terminal 20C, supplying an interpolated digital signal to the digital filter circuit 30, and switch 26 is set to its down position supplying the output of the gain adjusting circuit 24 to data output terminal 20D.

The operation of up-converting a digital signal having a clock rate fs2 supplied to data input terminal 20A by means of interpolation will now be described with reference to FIG. 7 and the timing diagrams of FIGS. 8(A) to 8(I). The interpolating circuit 21 comprises D-type flip-flops 21A and 21B, an AND gate 21C and an invertor 21D, wherein a digital signal having a clock rate fs2 (13.5 MHz) (FIGS. 8(A) and 8(B)) is supplied to the input of D-type flip-flop 21A. A clock signal ck-c (FIG. 8(C)) having the frequency fs1 (18 MHz) (pulse sequence C) is supplied to a counter 23A of the clock generating circuit 23 which counts the number of pulses of clock signal ck-c and supplies an output signal $C_O$ (FIG. 8(D)) having a pulse for every four (L) counts of clock signal ck-c. In addition, counter 23A supplies coefficient address data (ADR) to the filter coefficient generating block 40, further described below. Clock signal ck-c and signal $C_O$ are supplied to an OR gate 23B which produces signal d-ck (FIG. 8(E)) which pulses 3 (M) of every 4 (L) pulses of signal ck-c. D-type flip-flop 21A latches the digital signal at each pulse of signal d-ck, which is supplied to the clock input of D-type flip-flop 21A resulting in the D-type flip-flop 21A output shown in FIG. 8(F). The output of D-type flip-flop 21A is supplied to AND gate 21C and signal $C_O$ is supplied to AND gate 21C through invertor 21D resulting in AND gate 21C having an output as shown in FIG. 8(G). As show, AND gate 21C provides a null value in the digital signal when signal d-ck does not pulse. The output of AND gate 21C is supplied to D-type flip-flop 21B which latches the output of AND gate 21C at each pulse of clock signal ck-c (FIGS. 8(C) and 8(H)) resulting in D-type flip-flop 21B, supplying an interpolated digital signal having a clock rate fs1 (18 MHz) as shown in FIG. 8(I). The interpolated digital signal is supplied to terminal 20C through switch 25, which remains in its down position during up-converting.

The interpolated digital signal is filtered by the digital filter circuit 30 which provides a filtered digital signal to terminal 20B of the rate converting block 20, the operation of which is described below. The filtered digital signal, which now has a clock rate fs1 (18 MHz), is adjusted by the gain adjusting circuit 24 (discussed below) before being supplied to data output terminal 20D through switch 26, which, as stated above, is in its down position during up-converting of the clock rate of the digital signal.

The operation of down-converting a digital signal having a clock rate fs1 (18 MHz) will now be described with reference to FIG. 7 and the timing diagrams of FIGS. 9(A) to 9(H). A digital signal having a clock rate fs1 (18 MHz) (FIGS. 9(A) and 9(B)) supplied to data input terminal 20A passes through switch 25, which is in its up position during down-converting, to the digital filter circuit 30 at terminal 20C. The digital signal having the clock rate fs1 (18 MHz) is filtered (described below) and then supplied to the rate converting block 20 at terminal 20B.

As described above, the clock signal ck-c (FIG. 9(C)) having the frequency fs1 (18 MHz) is supplied to the clock generating circuit 23, which generates output signal $C_O$ (FIG. 9(D)) and signal d-ck (FIG. 9(E)). The filtered digital signal having the clock rate fs1 (18 MHz) is supplied to a D-type flip-flop 22A of the thinning circuit 22, which latches the signal at each pulse of signal d-ck, resulting in the D-type flip-flop 22A output shown in FIG. 9(F). The output of D-type flip-flop 22A is latched by another D-type flip-flop 22B at each pulse of a clock signal ck-V having the clock rate fs2 (13.5 MHz) (pulse sequence D) (FIG. 9(G)). The D-type flip-flop 22B supplies the filtered digital signal having the clock rate fs2 (13.5 MHz) as shown in FIG. 9(H) to data output terminal 20D through switch 26, which is in its up position during down-converting.

As described above, the gain adjusting circuit 24 adjusts the digital signal during up-conversion of the clock rate. The adjustment is necessary since the gain in the digital filter circuit 30 is different for up-conversion than for down-conversion. As is further described below, the gain of the digital filter circuit 30 during up-conversion is three-fourths as much as the gain during down-conversion, and thus, the gain adjusting circuit 24 provides a four-thirds gain to the digital signal during up-conversion to balance the conversion process.

The digital filter circuit 30, which is common to both up-conversion of the clock rate of a digital signal and down-conversion of the clock rate of a digital signal will now be described.

In general, during down-conversion of data having a clock rate of 18 MHz to data having a clock rate of 13.5 MHz, data $\{Y_n\}$, whose clock rate is 54 MHz, may be obtained by using the previously described filter transfer function:

$$F_1(z) = \sum_{j=0}^{11} k^* z^{-j}$$

The data $\{Y_n\}$ are classified into three classes identified as data $\{Y_{3n-1}\}$, data $\{Y_{3n}\}$ and data $\{Y_{3n-2}\}$. The first class, data $\{Y_{3n-1}\}$, which contains the coefficients $\{k_0, k_3, k_6, k_9\}$, are as follows:

$Y_2 = k_0*X_5 + k_3*X_4 + k_6*X_3 + k_9*X_2$ $Y_5 = k_0*X_6 + k_3*X_5 + k_6*X_4 + k_9*X_3$ $Y_8 = k_0*X_7 + k_3*X_6 + k_6*X_5 + k_9*X_4$ $Y_{11} = k_0*X_8 + k_3*X_7 + k_6*X_6 + k_9*X_5$ $Y_{14} = k_0*X_9 + k_3*X_8 + k_6*X_7 + k_9*X_6$

The second class, data $\{Y_{3n}\}$, which contains the coefficients $\{k_1, k_4, k_7, k_{10}\}$, are as follows:

$Y_3 = k_1*X_5 + k_4*X_4 + k_7*X_3 + k_{10}*X_2$ $Y_6 = k_1*X_6 + k_4*X_5 + k_7*X_4 + k_{10}*X_3$ $Y_9 = k_1*X_7 + k_4*X_6 + k_7*X_5 + k_{10}*X_4$ $Y_{12} = k_1*X_8 + k_4*X_7 + k_7*X_6 + k_{10}*X_5$

The third class, data $\{Y_{3n-2}\}$, which contains the coefficients $\{k_2, k_5, k_8, k_{11}\}$, are as follows:

$Y_1 = k_2*X_4 + k_5*X_3 + k_8*X_2 + k_{11}*X_1$ $Y_4 = k_2*X_5 + k_{5pi}*x_4 + k_8*X_3 + k_{11}*X_2$ $Y_7 = k_2*X_6 + k_5*X_5 + k_8*X_4 + k_{11}*X_3$ $Y_{10} = k_2*X_7 + k_5*X_6 + k_8*X_5 + k_{11}*X_4$ $Y_{13} = k_2*X_8 + k_5*X_7 + k_8*X_6 + k_{11}*X_5$

Therefore, the data $\{Y_{3n-1}\}$ may be obtained by a digital filter having the transfer function:

$$F_a(z) = k_0 + k_3 * z^{-1} + k_6 * z^{-2} + k_9 * z^{-3},$$

the data $\{Y_{3n}\}$ may be obtained by a digital filter having the transfer function:

$$F_b(z) = k_1 + k_4 * z^{-1} + k_7 * z^{-2} + k_{10} * z^{-3},$$

and the data $\{Y_{3n-2}\}$ may be obtained by a digital filter having the transfer function:

$$F_c(z) = k_2 + k_5 * z^{-1} + k_8 * z^{-2} + k_{11} * z^{-3}.$$

Thus, in the case of down-converting the clock rate of a digital signal, the data $\{Y_n\}$ may be obtained by utilizing digital filters operating in parallel having the transfer functions $F_a(z)$, $F_b(z)$ and $F_c(z)$.

During up-conversion of an input signal having a clock rate of 13.5 MHz to an output signal having a clock rate of 18 MHz, data $\{Y_n\}$, whose clock rate is 54MHz, may be obtained by using the filter transfer function $F_2(z)$, described above, wherein the data $\{Y_{4n}\}$, $\{Y_{4n+1}\}$, $\{Y_{4n+2}\}$ and $\{Y_{4n+3}\}$ may be obtained using the transfer functions $F_a(z)$, $F_b(z)$, $F_c(z)$ and $F_d(z)$, which are as follows:

$$F_a(z) = k_0 + k_4 * z^{-1} + k_8 * z^{-2}$$

$$F_b(z) = k_1 + k_5 * z^{-1} + k_9 * z^{-2}$$

$$F_c(z) = k_2 + k_6 * z^{-1} + k_{10} * z^{-2}$$

$$F_d(z) = k_3 + k_7 * z^{-1} + k_{11} * z^{-2}$$

Thus, in the case of up-converting the clock rate of a digital signal, the data $\{Y_n\}$ may be obtained by utilizing digital filters operating in parallel having the transfer functions $F_a(z)$, $F_b(z)$, $F_c(z)$ and $F_d(z)$.

Up-conversion and down-conversion may be obtained by initially up-converting the clock rate to the least common multiple of the clock rates of the input signal and the output signal, and then performing a thinning function to reduce the clock rate to a clock rate (i.e. output clock rate) of the output signal. However, if only the digital signal having the output clock rate is generated, then only one digital filter is necessary, and the utilization of a digital filter which generates a digital signal having a clock rate equal to the least common multiple of the clock rates of the input signal and the output signal is avoided.

During the down-conversion of input data having a clock rate of 18 MHz to output data having a clock rate of 13.5 MHz, each of the data $\{Y_{4n}\}$, $\{Y_{4n+1}\}$, $\{Y_{4n+2}\}$ and $\{Y_{4n+3}\}$ generated have clock rates of 13.5 MHz since the data $\{Y_n\}$ has a clock rate of 54 MHz. For example, the data $\{Y_{4n}\}$ is as follows:

$$Y_0 = k_1 * X_4 + k_4 * X_3 + k_7 * X_2 + k_{10} * X_1$$

$$Y_4 = k_2 * X_5 + k_5 * X_4 + k_8 * X_3 + k_{11} * X_2$$

$$Y_8 = k_0 * X_7 + k_3 * X_6 + k_6 * X_5 + k_9 * X_4$$

$$Y_{12} = k_1 * X_8 + k_4 * X_7 + k_7 * X_6 + k_{10} * X_5$$

$$Y_{16} = k_2 * X_9 + k_5 * X_8 + k_8 * X_7 + k_{11} * X_6$$

$$Y_{20} = k_0 * X_{11} + k_3 * X_{10} + k_6 * X_9 + k_9 * X_8$$

During the up-conversion of input data having the clock rate of 13.5 MHz to output data having a clock rate of 18 MHz, each of the data $\{Y_{3n}\}$, $\{Y_{3n+1}\}$ and $\{Y_{3n+2}\}$ generated have clock rates of 18 MHz since the data $\{Y_n\}$ has the clock rate of 54 MHz. For example, the data $\{Y_{3n+1}\}$ is as follows:

$$Y_1 = k_3 * X_3 + k_7 * X_2 + k_{11} * X_1$$

$$Y_4 = k_2 * X_4 + k_6 * X_3 + k_{10} * X_2$$

$$Y_7 = k_1 * X_5 + k_5 * X_4 + k_9 * X_3$$

$$Y_{10} = k_0 * X_6 + k_4 * X_5 + k_8 * X_4$$

$$Y_{13} = k_3 * X_6 + k_7 * X_5 + k_{11} * X_4$$

$$Y_{16} = k_2 * X_7 + k_6 * X_6 + k_{10} * X_5$$

$$Y_{19} = k_1 * X_8 + k_5 * X_7 + k_9 * X_6$$

$$Y_{22} = k_0 * X_9 + k_4 * X_8 + k_8 * X_7$$

$$Y_{25} = k_3 * X_9 + k_7 * X_8 + k_{11} * X_7$$

$$Y_{28} = k_2 * X_{10} + k_6 * X_9 + k_{10} * X_8$$

Given a clock rate $f_A$ of 18 MHz and a clock rate $f_B$ of 13.5 MHz, then $f_C$ equals the least common multiple of $f_A$ and $f_B$, 54 MHz, such that $f_C = M*f_A = L*f_B$, where M and L equal 3 and 4, respectively. Then, if the transfer function $F(z)$ of the filter having a unit delay component $z^{-1}$ at the clock rate $F_C$ (54 MHz) is:

$$F(z) = \sum_{k=0}^{N} a_k * z^{-k}$$

where $N = M*L*x$, $x = 1, 2, 3 \ldots$, N representing the number of taps, then the down-conversion of a digital signal having a clock rate of 18 MHz to a clock rate 13.5 MHz, can be accomplished by switching each of the following transfer functions $F_{M1}(z)$, $F_{M2}(z)$ and $F_{M3}(z)$ at each clock pulse, where:

$$F_{M1}(z) = \sum_{k=0}^{A} a_{3k} * z^{-3k}$$

$$F_{M2}(z) = \sum_{k=0}^{A} a_{3k+1} * z^{-(3k+1)}$$

$$F_{M3}(z) = \sum_{k=0}^{A} a_{3k+2} * z^{-(3k+2)}$$

wherein $A = (N/M) - 1$.

Further, the up-conversion of a digital signal having a clock rate of 13.5 MHz to a clock rate of 18 MHz, can be accomplished by switching each of the following transfer functions $F_{L1}(z)$, $F_{L2}(z)$, $F_{L3}(z)$ and $F_{L4}(z)$ at each clock pulse, where:

$$F_{L1}(z) = \sum_{k=0}^{B} a_{4k} * z^{-4K}$$

$$F_{L2}(z) = \sum_{k=0}^{B} a_{4k+1} * z^{-(4k+1)}$$

$$F_{L3}(z) = \sum_{k=0}^{B} a_{4k+2} * z^{-(4k+2)}$$

$$F_{LA}(z) = \sum_{k=0}^{B} a_{4k+3} \cdot z^{-(4k+3)}$$

(in which B=(N/L)−1) and therefore, only one digital filter is utilized for both up-conversion and down-conversion of the clock rate of a digital signal.

Figure 10A:
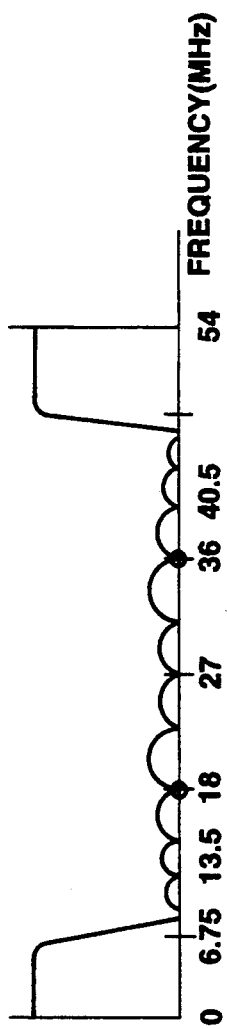
FIGS. 10(A) to 10(C), 11 and 12 illustrate frequency characteristics of embodiments of digital filters in accordance with the present invention.
Figure 10B:
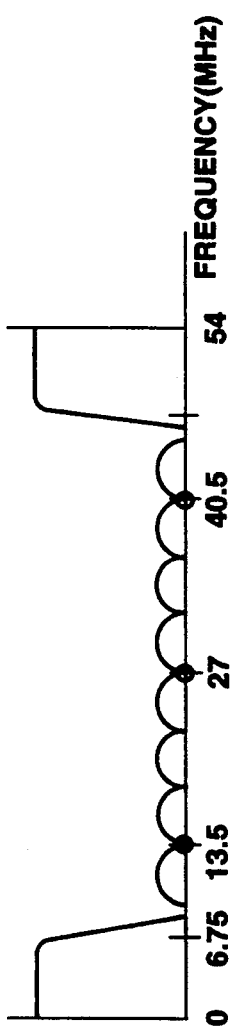
Figure 10C:
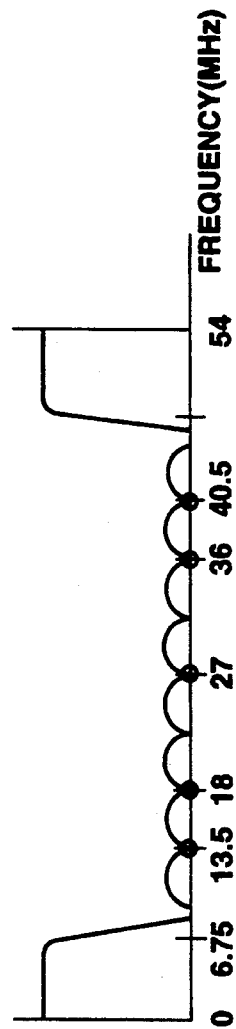

In the above described filter, it is necessary to "match" the summation of the coefficients of each sub-filter such that AC components (i.e. frequency distortion) are not introduced into the signal by any sub-filter when a pure DC signal is supplied to the filter. To "match" the sub-filters, "0" points are located at the signal frequency and its harmonics. During down-conversion of a clock rate of 18 MHz to 13.5 MHz, "0" points are located at frequencies of 18 MHz and 36 MHz resulting in a filter having the frequency characteristic shown in FIG. 10(A). Similarly, during up-conversion of a clock rate of 13.5 MHz to 18MHz, "0" points are located at frequencies of 13.5 MHz, 27 MHz and 40.5 MHz, resulting in a filter having the frequency characteristic shown in FIG. 10(B). However, since the filter characteristic at the pass-band portions of the up-conversion filter and the down-conversion filter are the same (FIGS. 10(A) and 10(B)), a filter having the frequency characteristic shown in FIG. 10(C) which has "0" points at the frequencies, 18 MHz, 36 MHz, 13.5 MHz, 27 MHz and 40.5 MHz, can be used for both up-conversion and down-conversion of the clock rate of a digital signal.

Figure 11:
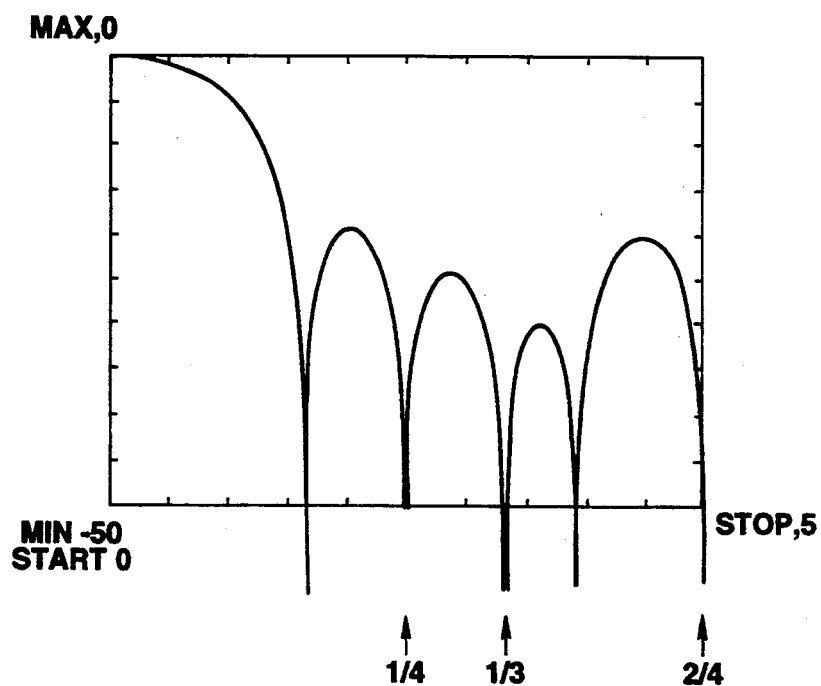

Therefore, the digital filter circuit 30 in accordance with this invention contains "0" points at frequencies of 18 MHz, 36 MHz, 13.5 MHz, 27 MHz and 40.5 MHz when the clock rate of a digital signal is converted between the clock rates of 13.5 MHz and 18 MHz. The digital filter circuit 30 may, for example, be realized by a digital filter having twelve taps having the frequency characteristic shown in FIG. 11, whose transfer function is:

$$F_A(z) = -1 + 0z^{-1} + 1z^{-2} + 3z^{-3} + 4z^{-4} + 4z^{-5} + 5z^{-6} + 4z^{-7} + 3z^{-8} + 1z^{-9} + 0z^{-10} - 1z^{-11}$$

As illustrated below, the summation of the coefficients of the three components (i.e. sub-filters) of the digital filter for down-conversion are equal:

$k_0+k_3+k_6+k_9 = -1+3+5+1 = 8$ $k_1+k_4+k_7+k_{10} = 0+4+4+0 = 8$ $k_2+k_5+k_8+k_{11} = 1+5+3-1 = 8$

Similarly, the summation of the coefficients of the four components of the digital filter for up-conversion are equal:

$k_0+k_4+k_8 = -1+4+3 = 6$ $k_1+k_5+k_9 = 0+5+1 = 6$ $k_2+k_6+k_{10} = 1+5+0 = 6$ $k_3+k_7+k_{11} = 3+4-1 = 6$

Figure 12:
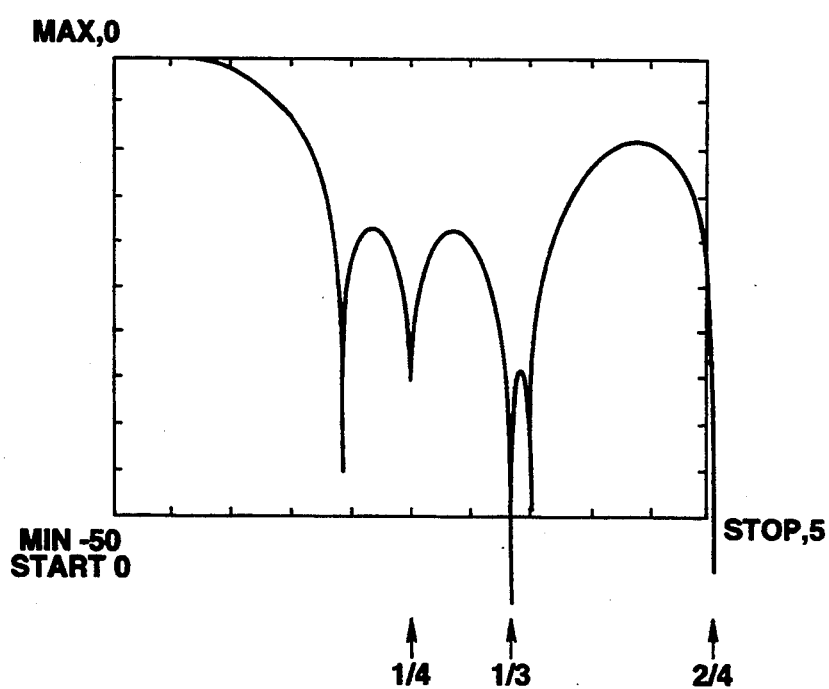

Another example of a digital filter in accordance the present invention has a characteristic as shown in FIG. 12, and has the transfer function:

$$F_B(z) = -1 + 0z^{-1} + 0z^{-2} + 3z^{-3} + 4z^{-4} + 6z^{-5} + 6z^{-6} + 4z^{-7} + 3z^{-8} + 0z^{-9} + 0z^{-10} - 1z^{-11}$$

As shown below, the summation of the coefficients of the three components of this digital filter for down-conversion are equal:

$k_0+k_3+k_6+k_9 = -1+3+6+0 = 8$ $k_1+k_4+k_7+k_{10} = 0+4+4+0 = 8$ $k_2+k_5+k_8+k_{11} = 0+6+3-1 = 8$

Similarly, the summation of the coefficients of the four components of the digital filter for up-conversion are equal:

$k_0+k_4+k_8 = -1+4+3 = 6$ $k_1+k_5+k_9 = 0+6+0 = 6$ $k_2+k_6+k_{10} = 0+6+0 = 6$ $k_3+k_7+k_{11} = 3+4-1 = 6$

Figure 13:
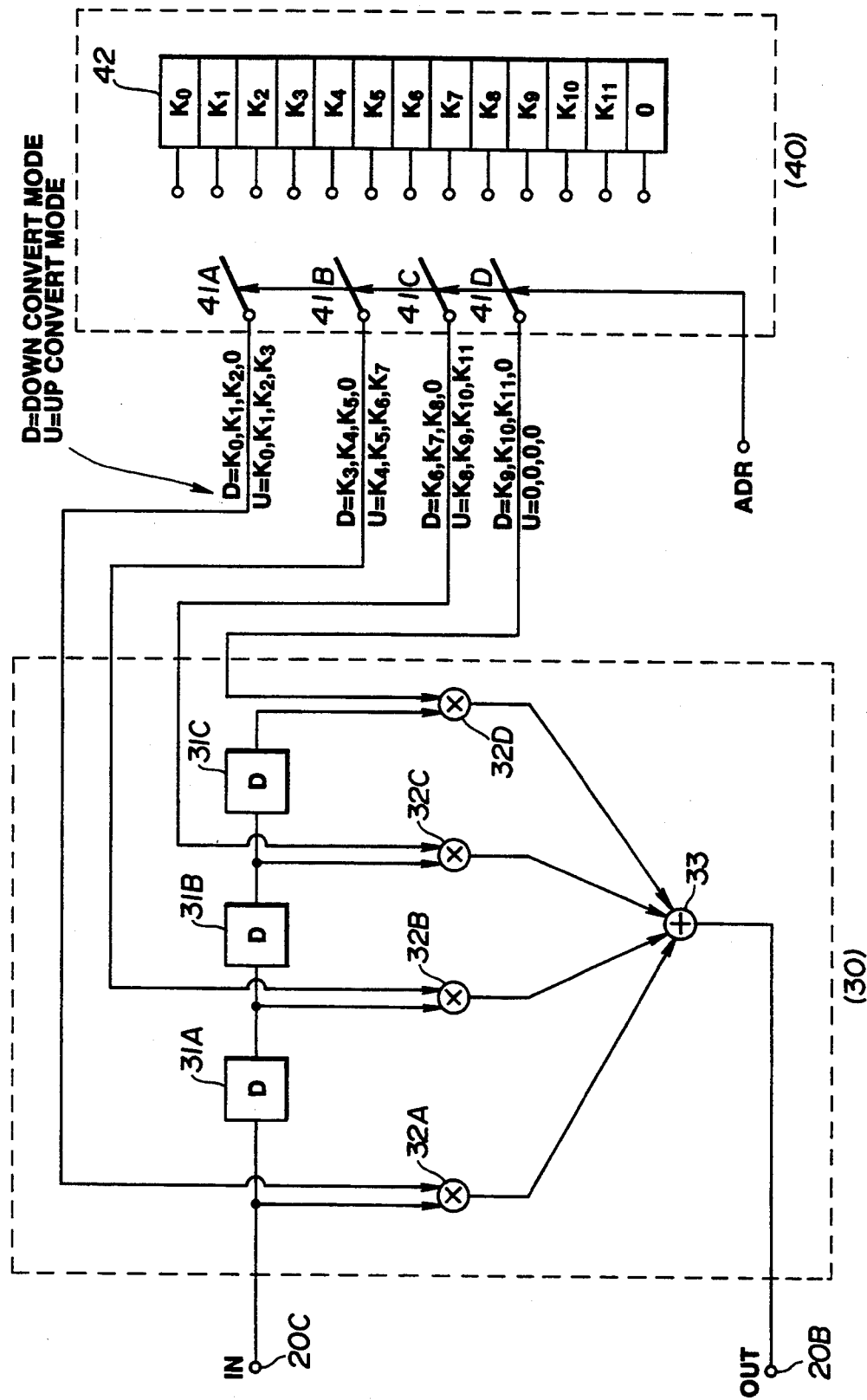
FIG. 13 is a block diagram of the digital filter of FIG. 6.

FIG. 13 illustrates the digital filter circuit 30 and the filter coefficient generating block 40 of the FIG. 5 embodiment. The digital filter circuit 30 contains three latch circuits 31A, 31B and 31C, four multipliers 32A, 32B, 32C and 32D and an adder 33 and the filter coefficient generating block 40 contains four switches 41A, 41B, 41C and 41D and a coefficient memory 42 for storing twelve coefficients.

During down-conversion and up-conversion, the digital signal supplied from terminal 20C of the rate converting block 20 is latched by latch circuit 31A at the clock rate of 18 MHz, wherein latch circuit 31B latches a delayed signal and latch circuit 31C latches a twice delayed signal. The un-delayed digital signal at terminal 20C is also supplied to multiplier 32A and the outputs of latch circuits 31A, 31B and 31C are supplied to multipliers 32B, 32C and 32D, respectively. As shown in FIG. 13, the coefficient values supplied to multipliers 32A, 32B, 32C and 32D depend upon whether the clock rate is being down-converted or up-converted, and in addition, change for each clock pulse of an 18 MHz frequency signal. Switches 41A to 41D supply different coefficient values to the respective multipliers in accordance with the coefficient address data (ADR) supplied from the clock generating circuit 23 of the rate converting block 20. The four multiplied signals are added by adder 33, and supplied to terminal 20B of the rate converting block 20.

As previously described, the gain adjusting circuit 24 of the rate converting block 20 adjusts the digital signal during up-conversion of the clock rate. As can be appreciated, four signals are added by adder 33 during down-conversion. In contrast, during up-conversion, only three signals are added by adder 33. Therefore, the ratio during the gains of up-conversion to down-conversion is 3:4, so that the circuit 24 adjusts the gain accordingly.

It is to be noted that in the case where the ratio of the clock rates is M:L, when either M or L equals $2^n$ the gain during the conversion from M to L may be 1, whereby the gain during L to M conversion may be set accordingly. However, if neither M nor L equals $2^n$, the gain during up-conversion and during down-conversion is 1/M and 1/L, respectively.

While the present invention has been particularly shown and described in conjunction with preferred embodiments thereof, it will be readily appreciated by those of ordinary skill in the art that various changes may be made without departing from the spirit and scope of the invention. For example, the bi-directional rate convertor of the present invention is not limited to the specific clock rates discussed above, but may convert between other clock rates as well using a digital filter having different frequency characteristics.

As another example, although the present discussion is directed to a camcorder which records a digital image signal, the bi-directional rate convertor of the present invention is not limited solely to this type of signal or device and may be widely applied to converting the clock rates of various other digital signals in various devices.

Still further, although the bi-directional rate converting apparatus as described above converts a digital signal between two different clock rates, it may be easily modified to convert the clock rate of a digital signal having one clock rate to a selectable clock rate.

Therefore, it is intended that the appended claims be interpreted as including the embodiments described herein, the alternatives mentioned above, and all equivalents thereto.

What is claimed is:

1. Bi-directional rate converting apparatus for converting a clock rate of a digital signal having one of a lower clock rate $f_B$ and a higher clock rate $f_A$ to the other thereof, comprising:

rate converting means for selectively up-converting said clock rate $f_B$ of said digital signal to the clock rate $f_A$ and for selectively down-converting said clock rate $f_A$ of said digital signal to said clock rate $f_B$; and filter means coupled to said rate converting means for filtering said digital signal in accordance with a predetermined frequency characteristic, said frequency characteristic having "0" points at frequencies of $(f_C/M)*x$, x having integer values from 1 to $(M-1)$, and at frequencies of $(f_C/L)*y$, y having integer values from 1 to $(L-1)$, wherein $f_C$ is a least common multiple of $f_A$ and $f_B$ such that $f_C=M*f_A=L*f_B$, M and L having respective integer values, wherein frequencies of said digital signal at the "0" point frequencies are suppressed substantially to zero by said filter means.

2. The apparatus of claim 1, wherein the rate converting means comprises interpolating means for interpolating the digital signal having the clock rate $f_B$ to convert the clock rate thereof to $f_A$.

3. The apparatus of claim 2, wherein the interpolating means comprises:

pulse generating means for generating a pulse sequence C having said clock rate $f_A$; and latch means for latching the digital signal having the clock rate $f_B$ at M of each successive group of L pulses of said pulse sequence and latching a null value at each pulse other than said M of each successive group of L pulses, said latch means being operative to supply said latched digital signal and said latched null value as an output digital signal having the clock rate $f_A$.

4. The apparatus of claim 1, wherein the rate converting means comprises thinning means for thinning the digital signal having the clock rate $f_A$ to convert the clock rate thereof to $f_B$.

5. The apparatus of claim 4, wherein the thinning means comprises:

pulse generating means for generating a pulse sequence C having said clock rate $f_A$ and for generating a pulse sequence D having said clock rate $f_B$; and first latch means for latching the digital signal having the clock rate $f_A$ at M of each successive group of L pulses of said pulse sequence C and supplying a latched digital signal as an output; and second latch means for latching said latched digital signal at each pulse of said pulse sequence D and supplying the digital signal having the clock rate $f_B$ as an output.

6. The apparatus of claim 1, wherein the filter means is coupled to an output of the rate converting means when the rate converting means up-converts the clock rate of the digital signal and is coupled to an input of the rate converting means when the rate converting means down-converts the clock rate of the digital signal.

7. The apparatus of claim 1, further comprising gain adjusting means for multiplying the digital signal by a gain adjusting coefficient.

8. Bi-directional rate converting apparatus for converting a clock rate of a digital signal having one of a lower clock rate $f_B$ and a higher clock rate $f_A$ to the other thereof comprising:

interpolating means for interpolating said digital signal having said clock rate $f_B$ to produce an interpolated digital signal having said clock rate $f_A$;

means for selecting said interpolated digital signal having said clock rate $f_A$ in an up-conversion mode of the apparatus and for selecting said digital signal having said clock rate $f_A$ in a down-conversion mode of the apparatus;

filter means for filtering the selected one of said interpolated digital signal and said digital signal and supplying a filtered digital signal having said clock rate $f_A$ as an output, said filter means being operative to filter the selected signal in accordance with a predetermined frequency characteristic having "0" points at frequencies of $(f_C/M)*x$, x having integer values from 1 to $(M-1)$, and at frequencies of $(f_C/L)*y$, y having integer values from 1 to $(L-1)$, wherein $f_C$ is a least common multiple of $f_A$ and $f_B$ such that $f_C=M*f_A=L*f_B$, M and L having respective integer values, wherein frequencies of said selected signal at the "0" point frequencies are suppressed substantially to zero by said filter means;

thinning means for thinning said filtered digital signal having said clock rate $f_A$ to produce an output digital signal having said clock rate $f_B$ in the down-conversion mode; and means for supplying said filtered digital signal having said clock rate $f_A$ as an output digital signal in the up-conversion mode and for supplying the thinned filtered digital signal having the clock rate $f_B$ as the output digital signal in the down-conversion mode.

9. The apparatus of claim 8, wherein the means for supplying the filtered digital signal having the clock rate $f_A$ as the output digital signal comprises gain adjusting means for adjusting a gain of the output digital signal having the clock rate $f_A$.

10. The apparatus of claim 9, wherein the gain adjusting means multiplies the filtered digital signal having the clock rate $f_A$ by a gain adjusting coefficient substantially equal to L/M.

11. The apparatus of claim 9, wherein the filter means comprises:
   delay means for delaying said selected signal by increments of a clock pulse period corresponding with said clock rate $f_A$ to produce respective delayed signals, each of said respective delayed signals being delayed by a different number of said increments of said clock pulse period corresponding with said clock rate $f_A$;
   coefficient adjusting means for adjusting said selected signal and said respective delayed signals by respective coefficient values to produce respective adjusted signals; and
   summing means for summing said respective adjusted signals to produce the filtered digital signal having the clock rate $f_A$ as an output.

12. The apparatus of claim 11, wherein the respective coefficient values have respectively different values during each cycle of a clock signal having the clock rate $f_A$.

13. A video camera comprising:
   image pickup means for providing a digital image signal having a clock rate $f_A$;
   recording and reproducing means for selectively recording a digital image signal having a clock rate $f_B$ in a recording medium in a recording mode of the video camera and for selectively reproducing a digital image signal having said clock rate $f_B$ from said recording medium in a reproducing mode of the video camera, said clock rate $f_B$ being different from said clock rate $f_A$; and
   rate converting means for selectively converting the clock rate $f_A$ of the digital image signal provided from said image pickup means to the clock rate $f_B$ and supplying said digital image signal having the clock rate $f_B$ to said recording and reproducing means and for selectively converting the clock rate $f_B$ of said reproduced digital image signal to the clock rate $f_A$ to produce a rate converted reproduced signal, said rate converting means including filter means for filtering a selected one of the digital image signal and the rate converted reproduced signal in accordance with a predetermined frequency characteristic, said frequency characteristic having "0" points at frequencies of $(f_C/M)*x$, x having integer values from 1 to (M−1), and at frequencies of $(f_C/L)*y$, y having integer values from 1 to (L−1), wherein $f_C$ is a least common multiple of $f_A$ and $f_B$ such that $f_C = M*f_A = L*f_B$, M and L having respective integer values, and wherein frequencies of the selected signal at the "0" point frequencies are suppressed substantially to zero by said filter means.

14. The video camera of claim 13, wherein the rate converting means comprises interpolating means for interpolating the reproduced digital image signal having the clock rate $f_B$ to produce the rate converted reproduced signal having the clock rate $f_A$.

15. The video camera of claim 14, wherein the interpolating means comprises:
   pulse generating means for generating a pulse sequence C having said clock rate $f_A$; and
   latch means for latching the reproduced digital image signal having the clock rate $f_B$ at M of each successive group of L pulses of said pulse sequence C, and for latching a null value at each pulse other than said M of each successive group of L pulses, said latch means being operative to supply the latched digital image signal and the latched null value as the rate converted reproduced signal having the clock rate $f_A$.

16. The video camera of claim 13, wherein the rate converting means comprises thinning means for thinning the digital image signal having the clock rate $f_A$ to produce the digital image signal having the clock rate $f_B$.

17. The video camera of claim 16, wherein the thinning means comprises:
   pulse generating means for generating a pulse sequence C having said clock rate $f_A$ and for generating a pulse sequence D having said clock rate $f_B$; and
   first latch means for latching the digital image signal having the clock rate $f_A$ at M of each successive group of L pulses of said pulse sequence C and supplying a latched digital image signal as an output; and
   second latch means for latching said latched digital image signal at each pulse of said pulse sequence D and supplying the digital image signal having the clock rate $f_B$ as an output.

18. The video camera of claim 13, further comprising gain adjusting means for multiplying a selected one of the digital image signal and the rate converted reproduced signal by a gain adjusting coefficient.

* * * * *